United States Patent [19]

Herzberg et al.

[11] Patent Number: 5,023,791
[45] Date of Patent: Jun. 11, 1991

[54] AUTOMATED TEST APPARATUS FOR AIRCRAFT FLIGHT CONTROLS

[75] Inventors: Garry G. Herzberg, Renton; Robert C. Reynolds, Seattle, both of Wash.

[73] Assignee: The Boeing Company, Seattle, Wash.

[21] Appl. No.: 478,358

[22] Filed: Feb. 12, 1990

[51] Int. Cl.⁵ .................... G06F 15/20; G01M 19/00
[52] U.S. Cl. ........................ 364/424.04; 364/424.03; 324/73.1; 371/15.1
[58] Field of Search ............... 364/424.01, 424.03, 364/424.04, 431.01, 578, 550, 551.01, 579, 580; 324/73.1; 371/15.1, 25.1, 26, 27, 71; 73/117.2

[56] References Cited

U.S. PATENT DOCUMENTS

| | | | |
|---|---|---|---|
| 4,055,801 | 10/1977 | Pike et al. | 371/25.1 |
| 4,454,588 | 6/1984 | O'Brien | 364/551 |
| 4,626,996 | 12/1986 | Arlott | 364/550 |
| 4,799,220 | 1/1989 | Nielsen | 371/25.1 |
| 4,821,216 | 4/1989 | Howell et al. | 364/551.01 |
| 4,821,217 | 4/1989 | Jackson et al. | 73/117.2 |
| 4,841,456 | 6/1989 | Hogan, Jr. et al. | 371/25.1 |
| 4,845,617 | 7/1989 | Kamenetz et al. | 364/424.04 |

Primary Examiner—Gary Chin
Attorney, Agent, or Firm—Christensen, O'Connor, Johnson & Kindness

[57] ABSTRACT

An automated test apparatus (10) for testing the flight controls system of an aircraft (12) as part of an integrated system for testing a plurality of aircraft systems. The automated test apparatus includes a system controller (16) having memory (18) for storing programmed instructions that control operation of the automated test apparatus, and for storing resulting flight controls system test data. The automated test apparatus includes a keyboard (20), a touch screen (24), and a tape drive (22) for entering programmed instructions and other information into the automated test apparatus, and for outputting test data from the system controller. Instruments (26) included in the automated test apparatus and controlled by the system controller generate test signals that are input to the aircraft's flight controls system, and monitor resulting test data signals that are produced by the flight controls system. The automated test apparatus is connected by an interface cable (28) to an onboard central maintenance computer (30) included in the aircraft. The central maintenance computer includes a non-volatile memory that is programmed to run onboard tests of the flight controls system, and is controlled by the system controller during testing in accordance with the programmed instructions to run the onboard tests.

25 Claims, 7 Drawing Sheets

AUTOMATED TEST APPARATUS FOR AIRCRAFT FLIGHT CONTROLS

TECHNICAL FIELD

The present invention relates to assembly testing of aircraft systems, and particularly, to an automated test apparatus and method for testing aircraft flight controls systems.

BACKGROUND OF THE INVENTION

The manufacture of an aircraft involves the complex assembly of many mechanical and electronic components, each of which must accurately and reliably function in coordination with other components to ensure a safe and reliable aircraft. Individual components are put through stringent testing before assembly, but must be further tested after assembly to ensure continued functionality and proper interconnection by wiring harnesses and/or pneumatic and hydraulic lines. It is also necessary to keep a permanent record of the tests performed on an aircraft during assembly, as mandated by federal quality control regulations and as required by aircraft manufacturers to facilitate later maintenance and failure analysis.

One of the systems embodied in any aircraft that must be tested during assembly is the flight controls system. The flight controls system comprises the various control surfaces disposed in the aircraft's wings, elevator, and tail that provide for control of the aircraft's altitude and direction. Coacting with these surfaces are cockpit controls, aircraft computers, drive motors, position sensing transducers, and "line replaceable units" that operate to control, monitor, and report the configuration or status of control surfaces. The components of the flight controls system are typically tested individually as they are installed onto the aircraft, and may later be tested contemporaneously with subsequently installed interdependent components and during subsequent maintenance of the aircraft.

Conventional methods for testing aircraft flight controls systems, as well as other aircraft systems, have depended heavily on manual manipulation of the aircraft controls and recording of test data by operators. Typically, to test any particular component of the aircraft over its complete service range while the aircraft is on the ground, the operator must manually position various control surfaces and set cockpit circuit breakers to simulate in-flight conditions such as altitude and air speed. The operator then takes portable test instruments to the point of the aircraft at which the component under test is located, and breaks into the aircraft wiring with test probes to monitor performance of that particular component. The resulting data is manually recorded for future reference. This process must be repeated for each component that is to be tested, consuming great time and expense and providing numerous opportunities for operator error.

More recently developed conventional aircraft test systems are semi-automated in an attempt to reduce the manual steps that must be performed by an operator. These semi-automated systems may rely on built-in test equipment (BITE) routines contained within individual line replaceable units (LRUs) embodied in the flight controls system. However, such systems are limited by their dependence on mechanical simulation of in-flight conditions through manual circuit breaker settings, manual positioning of cockpit controls and control surfaces, and the manual transcription of test data necessary to produce a quality control paper record of the test results for archiving.

An example of a conventional semi-automated aircraft test system is taught by U.S. Pat. No. 4,626,996 to Arlott. The semi-automated test system disclosed uses a master computer that communicates with an onboard flight computer and onboard transducers. However, the test system disclosed is also heavily dependent on a number of remote data acquisition units that include microprocessors and associated memory, and remote transducers that must be mounted on the various aircraft components to be tested. The system is further limited in that it does not provide for automated, electronic simulation of in-flight conditions during ground testing of the aircraft, but actually tests the aircraft systems while the aircraft is airborne.

SUMMARY OF THE INVENTION

In accordance with the claims, the present invention is an automated test apparatus for testing a flight controls system of an aircraft, the automated test apparatus being one component of an integrated system for testing a plurality of systems on an aircraft. The automated test apparatus includes a system controller that has a memory for storing programmed instructions that control operation of the test apparatus to automatically test the flight controls system, and for storing the resulting flight controls system test data. In addition, the apparatus includes components enabling an operator to enter information into, and output test data from, the system controller. Also included are instruments that generate a first set of signals that are input to the aircraft flight controls system and that monitor a second set of signals that are produced by the flight controls system, the instrumentation components being controlled by the system controller and connected thereto to provide digital signals to the system controller corresponding to the second set of signals produced by the flight controls system. An interface comprising the automated test apparatus connects the system controller to the aircraft flight controls system, enabling the system controller to automatically control the flight controls system in accordance with the programmed instructions, to effect the various functions of the flight controls system in order to test the flight controls system operation on the ground, in coordination with the first set of signals generated by the instrumentation components.

In a preferred embodiment, the apparatus is connected by the interface to an onboard central maintenance computer within the aircraft's flight equipment. The central maintenance computer is connected to the flight controls system of the aircraft, including a plurality of LRUs and control surface transducers. The central maintenance computer includes a non-volatile memory and is programmed to run onboard tests of the flight controls system. When connected, the system controller controls the central maintenance computer in accordance with the programmed instructions to run the onboard tests of the flight controls system, with results of the onboard tests being conveyed through the interface for storage by the system controller.

Several of the aircraft LRUs incorporate software simulation routines that may be invoked by the system controller during testing to simulate aircraft in-flight conditions, such as altitude and speed, while the aircraft is on the ground. The automated test apparatus also includes an air data test set that is capable of pneumatically stimulating Pitot sensors onboard the aircraft to mechanically simulate aircraft in-flight conditions during testing of the flight controls system.

The apparatus may further comprise secondary interface cables that are connected to electrical ports on the aircraft that would otherwise accommodate LRUs of the flight controls system, which have been removed. When so connected, the system controller acts to emulate the function of the removed LRUs during testing of the flight controls system, in accordance with the programmed instructions. The automated test apparatus includes many test instruments that are integrally mounted within the apparatus for ease of testing, and need not be transported individually about the aircraft to perform flight controls system testing. The substantial reliance of the automated test apparatus on the onboard aircraft equipment reduces the need to attach remote transducers to every aircraft flight control surfaces or to break into the aircraft wiring during testing. The high degree of automation of the test apparatus reduces the number of functions that must be performed by an operator during testing, as well as the resulting opportunity for error. Digital test results are stored by the system controller and may be relayed for storage to a central control unit that coordinates integrated aircraft systems testing, eliminating the need for intermediate data printouts.

Figure 5:
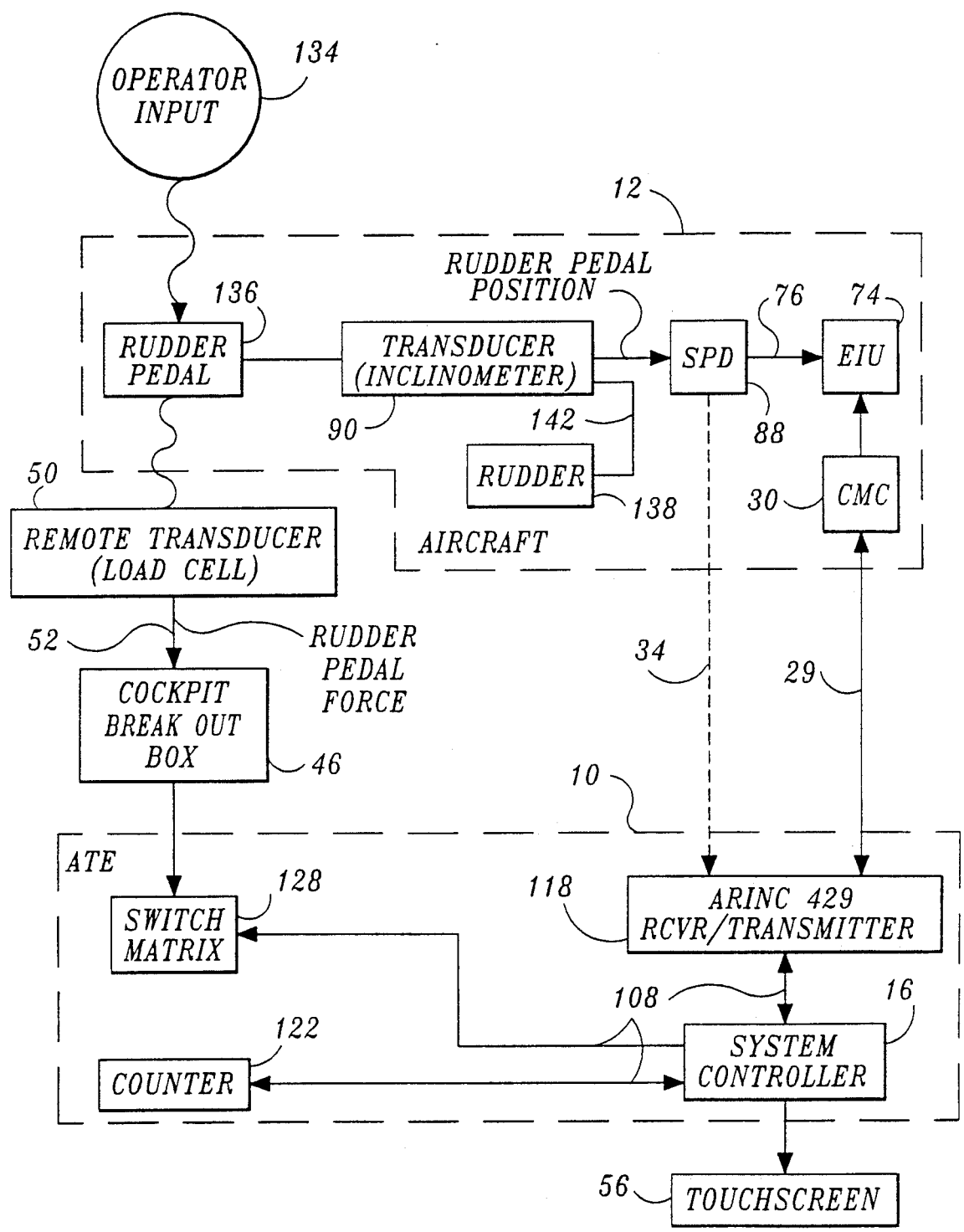
Figure 6:
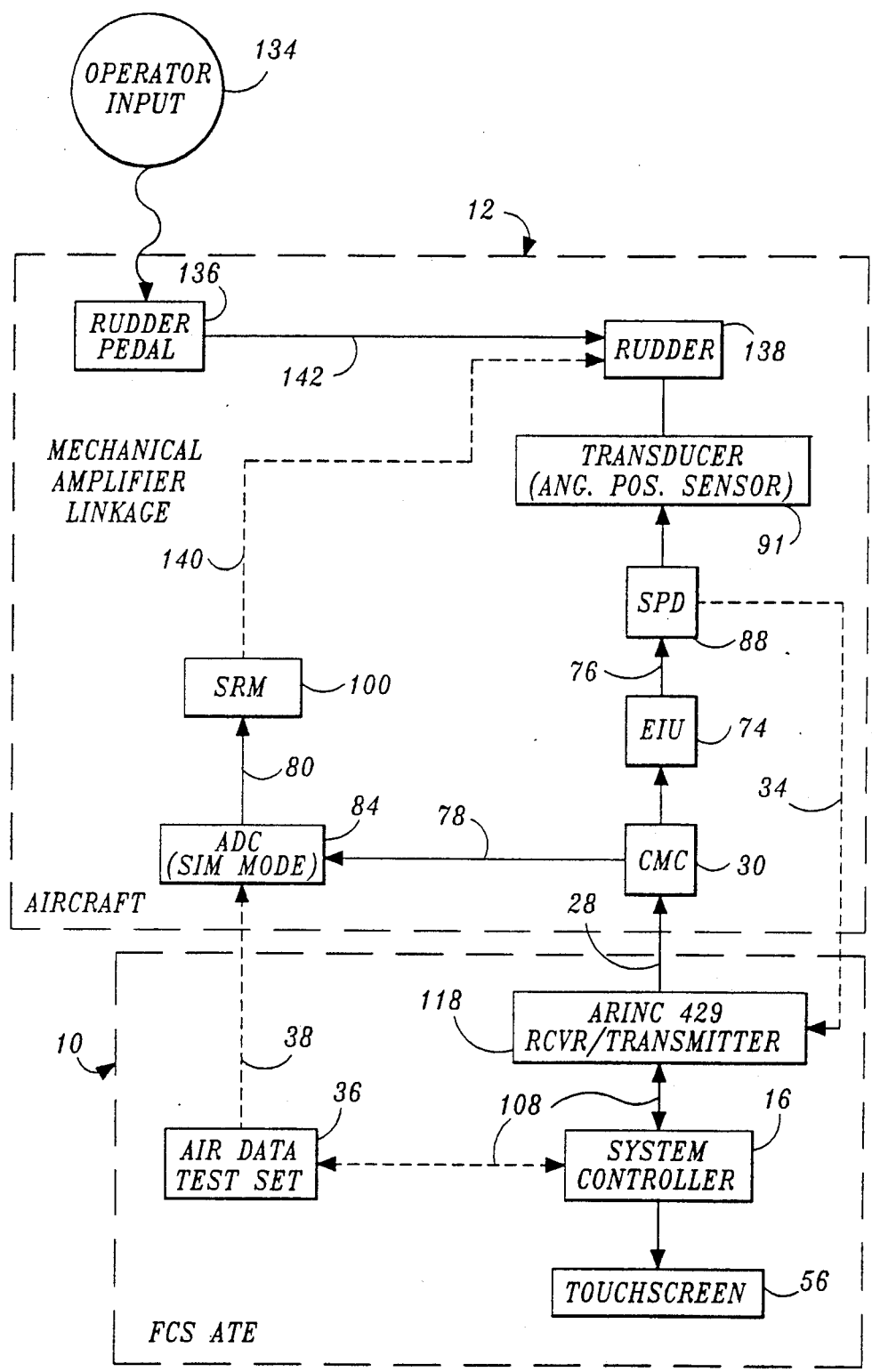
Figure 7:
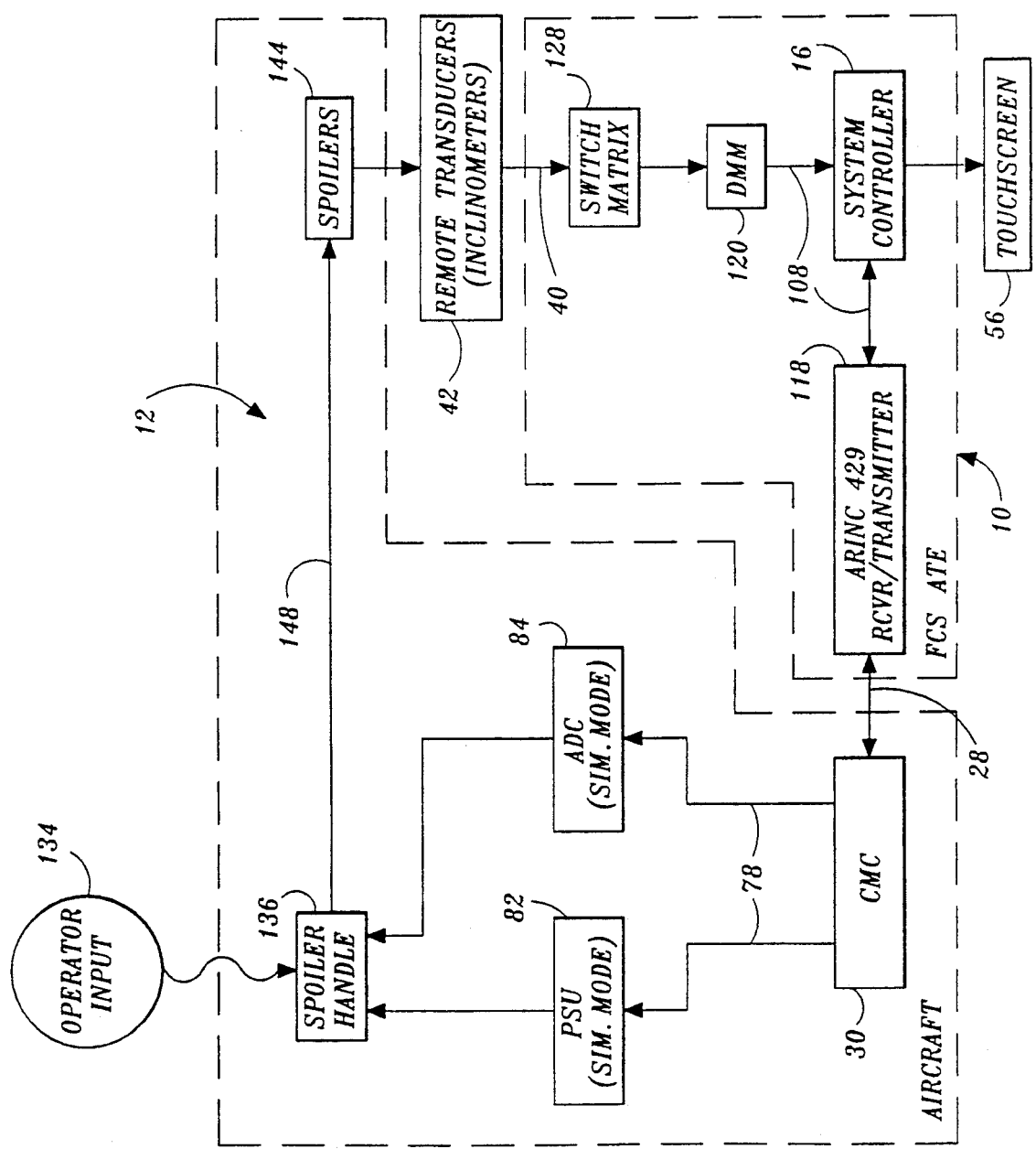

FIG, 5 is a functional block diagram representing a rudder control test performed by the automated test apparatus;

FIG. 6 is a functional block diagram representing the use of an aircraft in-flight condition simulation during performance by the automated test apparatus of the rudder control test of FIG. 5; and FIG. 7 is a functional block diagram representing a spoiler speed-brake test performed by the automated test apparatus.

DETAILED DESCRIPTION OF THE PREFERRED EMBODIMENT

Overview

Figure 1:
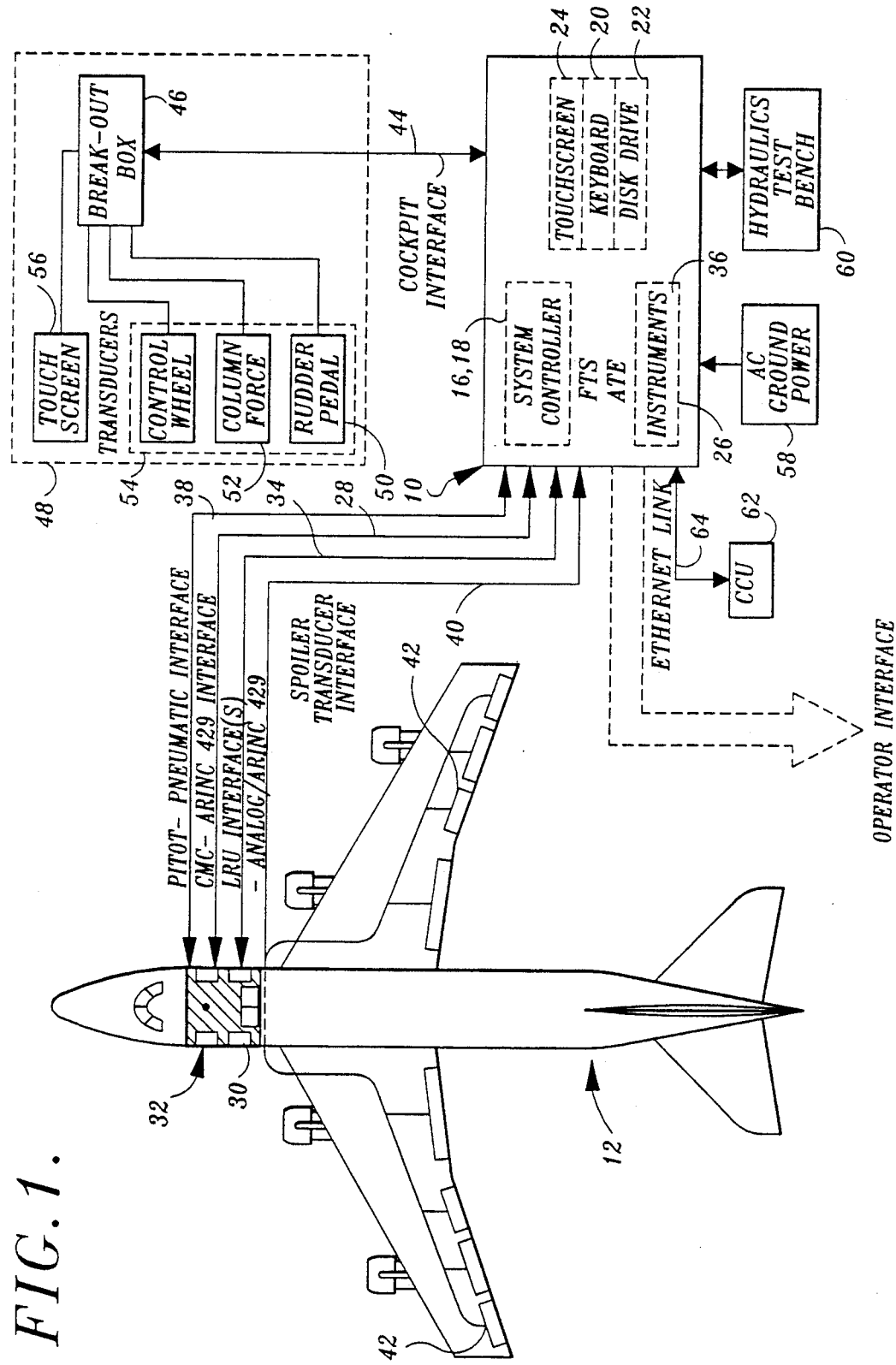
FIG. 1 is a block diagram representing the overall interconnection of the automated test apparatus to the aircraft.

FIG. 1 illustrates a preferred embodiment of the flight controls system automated test apparatus in an overview block diagram. The apparatus, which is generally referred to as an automated test equipment (ATE) 10, is shown interconnected to an aircraft 12 for testing. ATE 10 includes a system controller 16 having a volatile memory 18. Memory 18 is capable of storing programmed instructions enabling system controller 16 to control operation of ATE 10 during testing of the flight controls system of aircraft 12. Memory 18 also is capable of storing test data resulting from testing of the flight controls system by ATE 10.

ATE 10 includes operator interface equipment enabling an operator to enter information, such as the programmed instructions and aircraft configuration data, into the system controller, and to receive output from the system controller during and after testing. This operator interface equipment preferably includes a keyboard 20, a card or badge reader 104, and a touch screen 24, enabling the operator to monitor progress of a test and input test instructions and aircraft configuration data during the test by selecting from a displayed menu or list of choices.

A variety of electronic and mechanical instruments 26 are included in the test apparatus and controlled by system controller 16 in accordance with the programmed instructions. Instruments 26 generate a first set of signals that are input to the flight controls system to test selected components and subsystems within it, and the instruments monitor a second set of signals, representing test data, produced by the flight controls system during testing. Instruments 26 in some cases can provide digital signals to system controller 16 corresponding to selected signals from the second set of signals produced by the flight controls system. A primary interface between ATE 10 and aircraft 12 is provided by a central maintenance computer interface cable 28 that connects ATE 10 to an onboard central maintenance computer (CMC) 30 installed on the aircraft. CMC 30 is connected to various components of the aircraft flight controls system (in addition to the components of other aircraft systems) and includes a nonvolatile memory that is programmed to run onboard tests, referred to as built-in test equipment (BITE) routines, of the flight controls system. System controller 16 controls CMC 30, via CMC interface cable 28, during testing in accordance with the programmed instructions, causing the CMC to run the BITE routines and transmit flight controls information in coordination with the first set of signals generated by ATE instruments 26. Test data resulting from the BITE tests are transmitted via CMC interface cable 28 to system controller 16.

In order to test the aircraft flight controls system under the full range of test conditions in which the system is to operate on the ground, it is often necessary during testing of the aircraft to simulate in-flight conditions of the aircraft. System controller 16 may instruct, via CMC 30, various line replaceable units (LRUs) onboard the aircraft to perform built-in simulation routines to simulate in-flight conditions. Line replaceable unit (LRU) is a generic term for equipment components installed onboard an aircraft that are designed and intended to be easily replaced during testing or maintenance. Most LRUs used during functional testing include microprocessors and non-volatile memory that enable the LRUs to monitor and/or control other aircraft components in a form of distributed processing.

Still referring to FIG. 1, ATE 10 also includes secondary LRU interface cables that may be connected to aircraft 12 during testing of particular components of the flight controls system. The CMC 30 and various other LRUs embodied in the aircraft flight controls system are housed within an electrical and electronics (EE) bay 32 of aircraft 12. During testing, various LRUs may be removed from the EE bay, and LRU interface cables 34 from ATE 10 may be connected to the LRU ports in place of the removed LRUs, enabling system controller 16 to emulate the function of the removed LRUs and monitor signals during testing of the flight controls system.

ATE instruments 26 include an air data test set 36 that is capable of producing pneumatic pressure or vacuum. Air data test set 36 is placed in fluid communication with aircraft 12 by a pneumatic interface hose 38, which connects ATE 10 to static Pitot tube sensors mounted on aircraft 12. An appropriate air pressure applied to the Pitot tube sensors simulates aircraft flight conditions during testing. The use of each of the above-mentioned simulation and emulation capabilities of the ATE will be described subsequently in greater detail.

Although ATE 10 relies most heavily on onboard transducers mounted to aircraft control surfaces, the ATE may also include remote transducers that are connected directly to the ATE, rather than through CMC 30. The remote transducers are mountable on aircraft control surfaces and cockpit controls that are otherwise not monitored by test accessible transducers. For example, ATE 10 includes a spoiler transducer interface cable 40 connecting ATE 10 to remote clinometers 42 that are mounted on the aircraft spoilers during testing. Additional remote transducers are connected to the ATE 10 by a cockpit interface cable 44. Cockpit interface cable 44 terminates in a cable break out box (BOB) 46 that is mountable within a cockpit 48 of aircraft 12 during testing. Wires leading from BOB 46 fan out to the various cockpit remote transducers. The cockpit remote transducers include a load cell 50, which is mounted to the rudder pedal to monitor pedal force, a load cell 52 mounted on the steering column to monitor forces exerted thereon during movement of the column and control wheel, and a control wheel clinometer 54 affixed to the aircraft control wheel to monitor rotation of the wheel and column rotation.

Cockpit interface cable 44 and BOB 46 also includes wires connecting ATE 10 to a cockpit touch screen 56, or other operator interface, to be used by the operator in the cockpit during testing of the aircraft. Cockpit touch screen 56 outputs test queries and instructions from system controller 16 to the operator and receives test step selections and data concerning configuration of the aircraft from the operator during testing.

ATE 10 is connected to various external utility support services, including an AC power supply 58 for powering the ATE. ATE 10 may also be connected to a hydraulics test bench 60 to enable the ATE to control application of hydraulic pressurized fluid to the aircraft during testing when the aircraft engines are not operative to produce hydraulic power.

Integrated Functional Test System

In the preferred embodiment, the flight controls system ATE 10 described above is one of a number of ATEs embodied in an integrated functional test (IFT) system coordinated by a central control unit (CCU) 62 to test a number of subsystems on the aircraft, including the flight controls system. Flight controls system ATE 10 is connectable to CCU 62 by a network link 64, such as an ETHERNET TM link, to enable ATE 10 to receive programmed instructions from and transmit test data to CCU 62. A brief description of the IFT system, and the flight controls system to be tested by ATE 10, follows below.

In addition to flight controls system ATE 10, the IFT system includes ATEs to test other aircraft subsystems such as the avionics system, engine system, and power system. Each ATE includes appropriate test instrumentation and is connectable to communicate with the aircraft's CMC 30 over the ARINC 429 data buses, which are serial data buses originally specified by Aeronautical Radio Incorporated, and conventionally used for transmitting signals between commercial aircraft components. Each ATE interacts with a number of LRUs within the aircraft to be tested. The LRUs onboard an aircraft also conventionally communicate with each other over ARINC 429 buses and via discrete signals over interconnecting lines (not shown).

The various ATEs in the IFT system can be network linked to CCU 62. Programmed instructions for testing specific subsystems of the aircraft may then be downloaded from CCU 62 to the individual ATEs over the network links. Alternately, programmed instructions may be downloaded from the CCU onto a magnetic storage medium and then transferred to the ATEs by the use of a disk drive unit or other magnetic decoding unit included on the ATE. Test data generated during the tests performed by the ATEs are similarly transmitted to the CCU over the network links or stored on magnetic media. Test data from the various ATEs are gathered by CCU 62, integrated, and archived for quality assurance or later troubleshooting, analysis, and maintenance of the aircraft.

Flight Controls System

Figure 2:
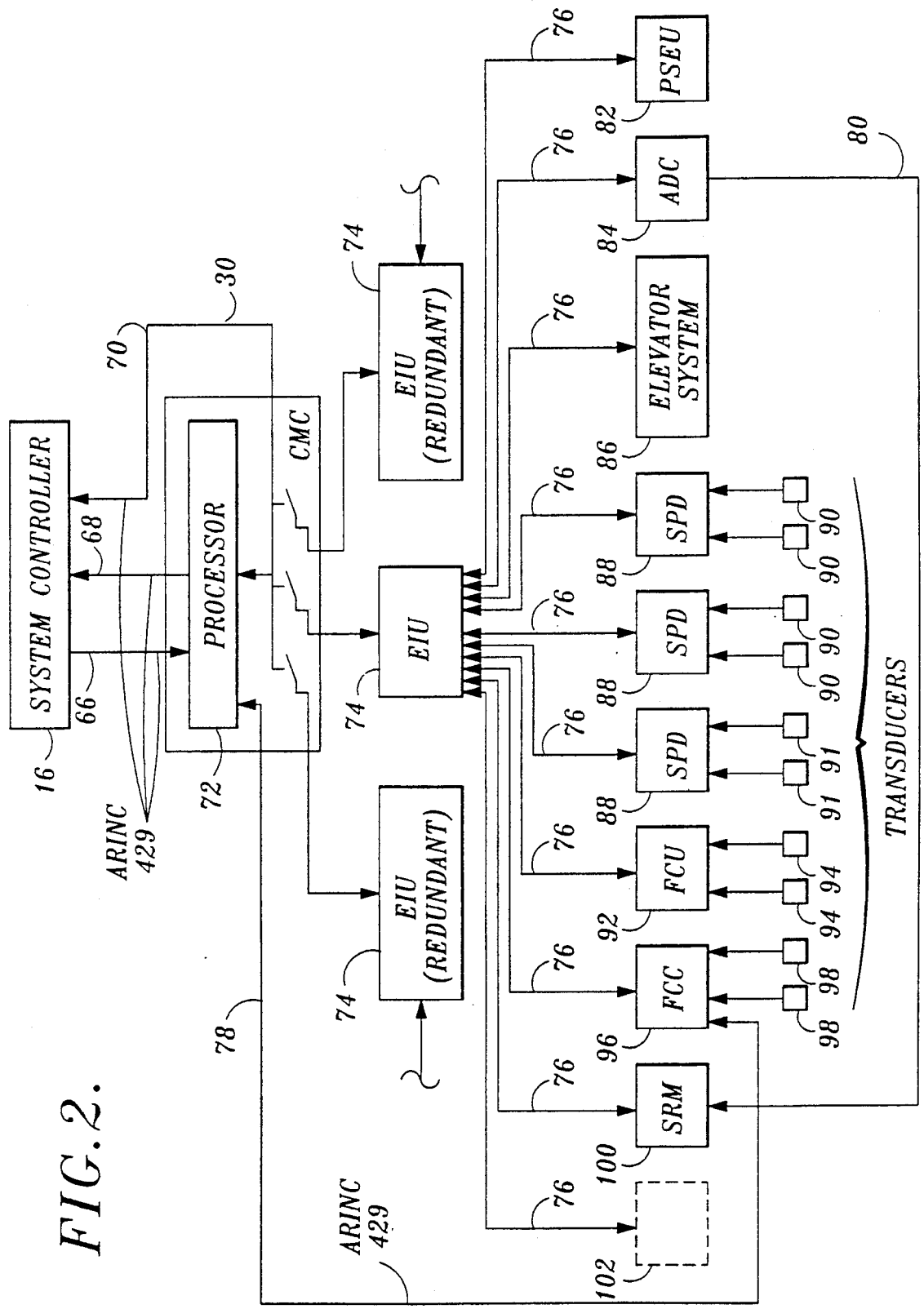
FIG. 2 is a schematic block diagram showing representative interconnections of the automated test apparatus to the aircraft line replaceable units and transducers.

Returning to testing of the flight controls system by ATE 10, the schematic block diagram of FIG. 2 provides details of the interface between ATE 10 and the aircraft's CMC 30, as well as other aircraft LRUs involved in testing the flight controls system. System controller 16 communicates with CMC 30 over three ARINC 429 data lines included in CMC interface cable 28. A first data line 66 transmits a first set of signals from system controller 16 to a processor 72 embodied in CMC 30. System controller 16 receives a second set of signals over a second data line 68 from CMC processor 72, and a third data line 70 that is wired directly through CMC 30 to a selected one of three redundant equipment interface units (EIUs) 74. Each EIU receives signals from a number of LRUs disposed on the aircraft. The EIUs are responsible for distributing LRU signals. The LRUs communicating with the EIUs typically function to control aircraft flight control surfaces and/or monitor the status of transducers thereon. These types of LRUs are hereinafter referred to as "operational LRUs". The operational LRUs communicate with the EIUs over ARINC 429 lines 76 and discrete signal lines (not shown), and also may communicate directly with CMC processor 72, bypassing the EIUs, over ARINC 429 lines 78, only one of which is illustrated by way of example. The operational LRUs also communicate directly with each other over ARINC 429 data lines 80, only one of which is exemplarily illustrated in FIG. 2, and via discrete signal lines (not shown).

Examples of operational LRUs used during testing of the flight controls system are illustrated in FIG. 2. The exact types of operational LRUs utilized in the flight controls system may vary from aircraft to aircraft, and the LRUs shown in FIG. 2 are only representative of those used for one type of aircraft. As shown therein, for example, one type of operational LRU is a proximity switch electronics unit (PSEU) 82. It monitors the configuration of various proximity switches in the aircraft that must be configured in a certain way for the aircraft to fly or land. Switches monitored include those indicating that the landing gear is up (or down), or that hatch doors are open (or closed).

An air data computer (ADC) 84 is another type of operational LRU that responds to changes in static and dynamic air pressure, as detected by the aircraft's static Pitot tube sensors (not shown) by generating signals representative of aircraft altitude and airspeed.

Referring still to FIG. 2, the aircraft includes three surface position digitizer (SPD) cards 88 that monitor transducers 90 and 91 mounted on various control surfaces, such as the aircraft's ailerons. SPD cards 88 convert the analog signals generated by transducers 90 and 91 to digital signals for transmission to EIUs 74 and through the CMC via leads 77. A flap control unit (FCU) 92 monitors the status of transducers 94, which are mounted on the aircraft's flaps, and responds to signal commands to readjust the flap settings. The FCU includes analog-to-digital conversion capabilities so that SPD cards are not required. A flight control computer (FCC) 96 functions as the aircraft's autopilot, and monitors a set of dedicated transducers 98 when controlling the aircraft's flight control surfaces in flight. A stabilizer rudder module (SRM) 100 monitors the positioning of the aircraft's rudder and stabilizers, responding to signal commands to reset the position of the rudder and stabilizer. A block 102 in FIG. 2 represents additional LRUs that may be used during testing of the flight controls system, depending on the particular configuration of aircraft 12.

CMC 30 is an onboard maintenance computer that monitors the condition of the aircraft performance during flights and stores the resulting data in an internal volatile memory bank (not shown) for maintenance purposes. During normal inflight operation, central processor 72 of CMC 30 receives signals that are passed by EIUs 74 from the operational LRUs. CMC processor 72 monitors the status of the operational LRUs and corresponding transducers, and receives data signals back through EIUs 74 for storage. Processor 72 also is capable of invoking BITE routines contained within the operational LRU software to test aircraft components. During functional testing of aircraft 12 on the ground, ATE 10 is capable of generating a signal command that is transmitted through CMC 30 and EIUs 74 to invoke these LRU BITE routines.

Some of the operational LRUs, such as PSEU 82, FCU 92, and ADC 84, include simulation routines that can be activated by the CMC. When an operational LRU is in a simulation mode, the LRU ignores the data it receives from its sensors, transducers, or switches, and instead generates false data signals that are transmitted to other components of the aircraft to reflect simulated in-flight conditions. During testing of the flight controls system, the ATE system controller 16 generates signals that are transmitted through CMC 30 and EIUs 74 to place a selected LRU in simulation mode and invokes the simulation routine. System controller 16 then generates command signals that are transmitted to the LRU in simulation mode, instructing the LRU to generate the specific (false) in-flight condition signals desired.

For example, PSEU 82 includes a software simulation routine that is activated by a command from system controller 16, which is transmitted via CMC 30. PSEU 82 is thus placed in the simulation mode and is instructed by CMC 30 (which during testing is acting in accordance with command signals received from system controller 16), to ignore the actual data the PSEU receives from the various proximity switches on the aircraft. PSEU 82 is then instructed to transmit to the other components of aircraft 12 false data concerning the configuration of the proximity switches, as instructed by system controller 16 via CMC 30. For instance, to simulate the aircraft being in the air while it is actually on the ground, PSEU 82 may be directed to generate false signals indicating that all hatch doors are closed and that landing gear is retracted.

ADC 84 also includes a simulation routine that is activated when system controller 16 commands CMC 30 to place the ADC in simulation mode. When in simulation mode, ADC 84 is instructed to ignore the pressure data coming from its ports that are connected to the Pitot tubes, and instead generates false data, as instructed by system controller 16, concerning aircraft altitude and speed. These false data are in turn transmitted to the other components of the aircraft. Alternatively, air pressure data may be mechanically simulated by using air data test set 36, described below in greater detail.

FCU 92 also includes a simulation routine. When placed in the simulation mode by a command signal sent from the system controller 16 via CMC 30, FCU 92 ignores the transducer signals it receives corresponding to the actual position of the aircraft flaps, and instead transmits false data concerning positioning of the flaps to other components of the aircraft.

Flight controls system ATE 10 performs a variety of tests of the flight controls system of aircraft 12. These tests typically check the positioning of aircraft control surfaces in response to control commands, the wiring connecting various aircraft components, and the performance of the LRUs, transducers, motors, and other equipment used in the flight controls system. These tests include, but are not limited to, the following.

A lateral controls test comprises three subtests of the aircraft's lateral control mechanisms. The first subtest, an aileron control test, checks the positioning of the aileron controls in response to cockpit commands. The second subtest, a speed-brakes (spoiler) test, checks the positioning of the speed-brake spoilers in response to cockpit commands generated by movement of the cockpit speed-brake lever. The control wheel forces subtest evaluates the "feel", or resistance to movement, of the control wheel and column in response to the position of the ailerons. Simulation routines for PSEU 82 may be invoked during the lateral controls test.

An aileron lockout test verifies that the ability to move the ailerons is eliminated, or "locked out", at certain speeds. The aileron lockout test also involves the invocation of ADC 84 and PSEU 82 simulation routines.

A rudder control test checks the positioning of the rudder in response to commands from the rudder pedal. The rudder control test also evaluates the "feel" of the rudder pedal in response to rudder position at various airspeeds and altitudes. The ADC 84 simulation routine may be invoked during the rudder control test.

The rudder ratio test checks for electronic faults detected by SRM 100 when the rudder is repositioned at various airspeeds and altitudes, and involves the invocation of ADC 84 simulation routines.

An elevator control test determines the positioning of the elevators in response to cockpit commands, and checks for the proper "feel" of the control column in response to the aircraft's altitude and speed. The elevator control test involves the invocation of ATE Pitot/static simulation routines (or alternatively the mechanical flight condition simulation using air data test set 36).

A yaw damper test checks for proper functioning of the yaw damper to determine whether the position of the rudder is properly adjusted in response to yaw movement of aircraft 12. The CMC invokes appropriate tests of the yaw damper executed by the yaw damper LRU under control of system controller 16.

A stabilizer trim system test checks to verify that the stabilizer position is properly set in response to commands from cockpit trim switches, and involves the invocation of ADC 84 simulation routines. Alternately, FCC 96 may be removed from EE bay 32 during the stabilizer trim system test. An LRU interface cable 34 is then connected to the FCC port, enabling system controller 16 to emulate the function of FCC 96 during testing, commanding SRM 100 to move the stabilizer. This emulation eliminates the need for an operator to activate command switches in the cockpit during testing.

A stabilizer control test checks for electronic faults between the various components of the stabilizer control system, and also involves the invocation of ADC 84 simulation routines.

The flaps leading and trailing edge phase tests check to verify that signals transmitted from the cockpit to move the leading and trailing edges are properly received by the motors controlling movement of the leading and trailing edges. Alternatively, FCU 92 may be removed, and system controller 16 connected by an LRU interface cable 34 to enable emulation of the FCU during testing, eliminating the need to manually move cockpit controls.

The leak check test verifies that pneumatic hoses connecting the air data computer, elevator system, and Pitot tube sensors are intact and pressure tight. The leak check test uses air data test set 36 of ATE 10 to pressurize the pneumatic hoses to be tested.

All of the tests performed by flight controls system ATE 10 are controlled by a software test executive program contained in system controller 16 memory. System controller 16 directly interfaces with an operator, allowing the operator to run, debug, and "buy-off" various tests. The test executive also allows the operator to download files from CCU 62 over network link 64. In addition to the programmed instructions, system controller 16 includes an operating system for housekeeping tasks, and look-up tables for transforming test signals received from CMC 30 into data corresponding to the angular positioning of various control surfaces. ATE 10 may be operated in a stand-alone mode, after having received program instructions from CCU 62 via network link 64 or as downloaded from a hard drive/streaming tape 22.

ATE 10 may also be operated as an interface, allowing an operator to access the built-in BITE routines of the operational LRUs, or in a debug mode, allowing the operator to access equipment onboard aircraft 12 via ATE 10 and CMC 30 to identify and correct test failures. Finally, ATE 10 may include software routines for periodic calibration and self-testing of its instruments.

ATE Test Cart

Figure 3:
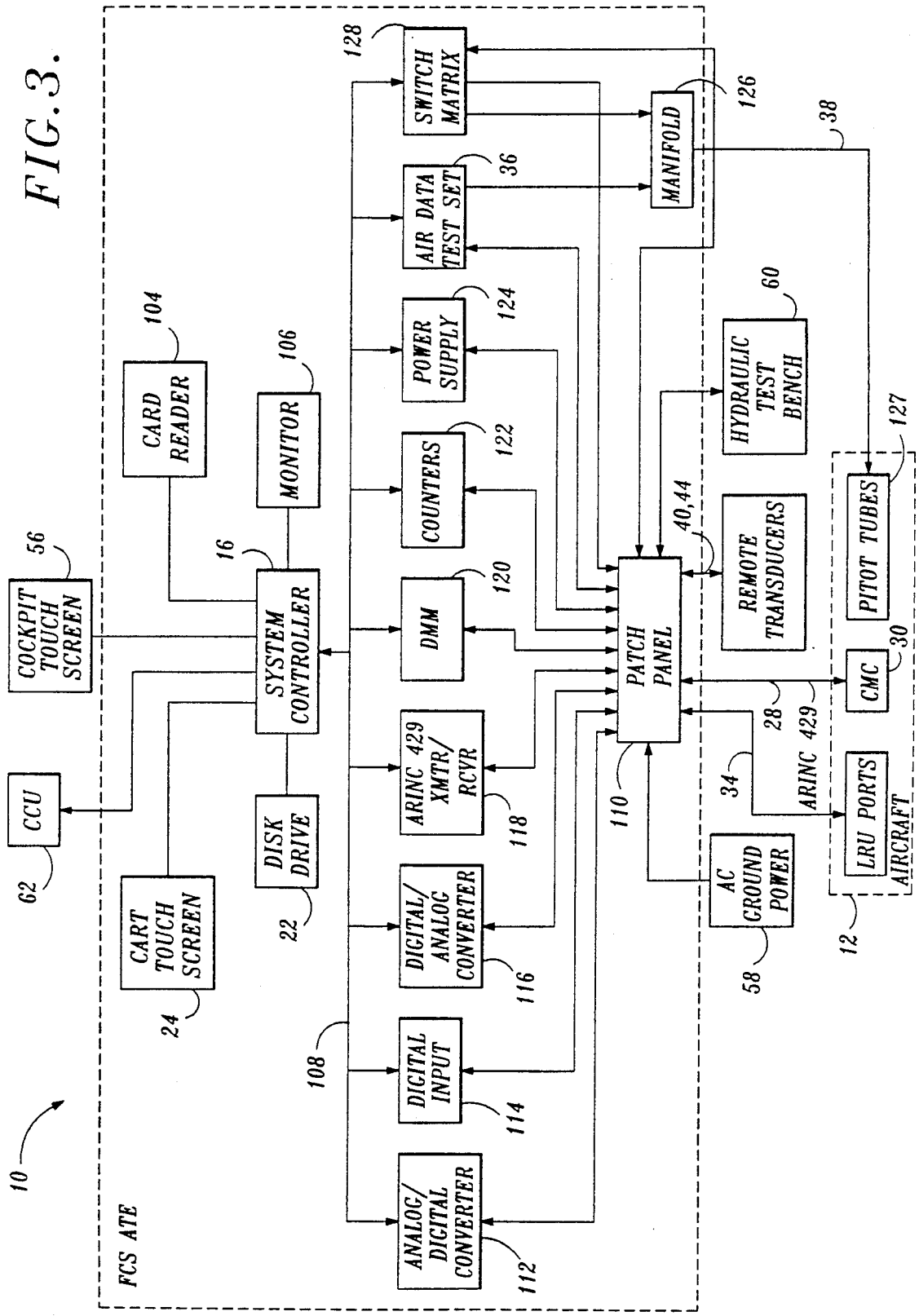
FIG. 3 is a block diagram showing the instrumentation and other components of the automated test apparatus, and interfaces to the aircraft.

ATE instruments 26 included in ATE 10 are illustrated in the block diagram of FIG. 3. The instruments described below and illustrated in FIG. 3 are provided as examples of instruments used in practicing the preferred embodiment of this invention, and are not intended to limit the types of instruments that may be utilized. Additional or fewer instruments, and other hardware components and interconnections, may be employed depending on the exact nature of tests to be performed on specific aircraft.

Referring to FIG. 3, system controller 16 is connected to various operator interface devices, preferably including card or badge reader 104, cart touch screen 24, hard drive/streaming tape 22, and cockpit touch screen 56. ATE 10 may also include other devices for reading instructions from, and encoding data on, magnetic media. In addition to the cart touch screen, a non-interactive monitor 106 may be included. System controller 16 communicates to various instruments 26 and the instruments communicate with each other over a communications bus 108 (preferably in accordance with the Institute of Electrical and Electronic Engineers (IEEE) Specification 488). Instruments 26 all are connected to a conventional patch panel 110 that allows for rapid reconfiguration of the instrument interconnections by designers or maintainers. Various aircraft interface cables 28, 34, 40, and 44 and ground support services are connected to ATE 10 at patch panel 110.

As previously discussed, CMC interface cable 28 contains ARINC 429 data lines. Remote transducer interface cables 40 (which is connected to the spoiler transducers), and 44 (which is connected to the cockpit transducers), typically contain analog data lines for receiving data from those transducers. LRU interface cables 34 contain either analog data lines or digital ARINC 429 data lines, depending on the type of data to be received when an LRU interface cable 34 is connected to replace an operational LRU during testing, i.e., to enable system controller 16 to perform an LRU emulation.

Referring still to FIG. 3, various electronic and mechanical instruments 26 are included in ATE 10 for the purpose of generating a first set of stimulus test signals that are transmitted to aircraft 12, and for monitoring a second set of data test signals representing results of the tests, which are transmitted from aircraft 12. ATE 10 includes an analog-to-digital converter 112 that converts analog data received over analog data lines in LRU interface cables 34 to digital signals for communication to system controller 16. A digital input card 114 monitors ATE internal voltages to determine whether any voltages required for running ATE 10 fall below permissible limits, such as when a reset button (not shown) on ATE 10 has been tripped. A digital-to-analog converter 116 is used to convert digital signals produced by system controller 16 to analog levels for communication with ground support equipment, such as hydraulic test bench 60.

An ARINC 429 transmitter/receiver 118 interfaces bi-directional communication over the ARINC 429 interface lines embodied in interface cables 28 and 34. Preferably, the ARINC 429 transmitter/receiver is capable of accommodating at least two each of receiver data lines 68 and 70 and the one transmitter data line 66, as shown in FIG. 2.

A digital multi-meter (DMM) 120 included in ATE 10 monitors test signals transmitted from aircraft 12. One or more digital counters 122 also monitor test signals transmitted to ATE 10 by the ATE transducers.

ATE 10 preferably includes one or more power supplies 124 that are used to both energize ATE 10 and to generate test signals for transmission to aircraft 12. For instance, ATE 10 may include a first 28-volt power supply to produce test stimulus signals, and a second 28-volt power supply and a ±12-volt power supply to energize ATE 10.

Air data test set 36 includes a vacuum pump and a pressure pump to provide a source of both sub- and hyper-atmospheric pressure. Air data test set 36 uses selected air pressure levels to mechanically simulate in-flight airspeed and altitude conditions. Pressurized air from air data test set 36 is connected to a manifold 126 and then into pneumatic hose interface 38 that covers the tips of Pitot tube sensors 127 on the aircraft. Pitot tube sensors 127 are in fluid communication with ADC 84 and an elevator system 86 and normally provide actual in-flight altitude and speed data to those LRUs. Pressure to the Pitot tubes may instead be supplied from air data test set 36 to simulate in-flight conditions. Alternately, pneumatic hose interface 38 may be directly connected to pressure ports on ADC 84 and elevator system 86, bypassing the Pitot tube sensors.

A switch matrix 128 is controlled by system controller 16 to selectably interconnect various instruments 26 to interface cables 28, 34, 40, and 44. Also, switch matrix 128 may be used to ground selected pins on interface connectors included on aircraft 12 to which the interface cables mate, to simulate the setting of specific cockpit switches.

Figure 4:
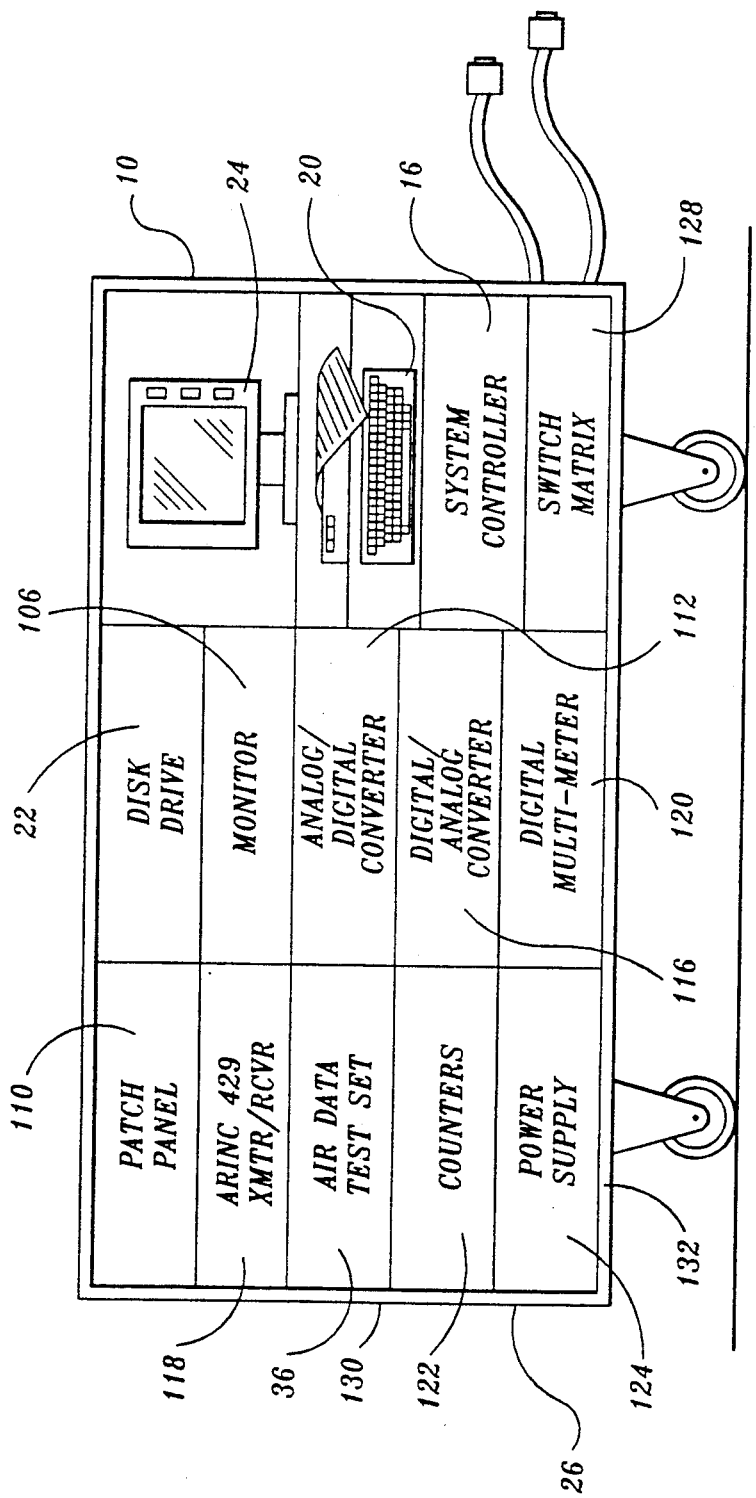
FIG. 4 illustrates a mobile cart-mounted, automated test apparatus.

Various instruments 26, system controller 16, and interface devices 22, 24, 104, and 106 of ATE 10 may be mounted within a cabinet 130 on a wheeled cart 132, as illustrated in FIG. 4. This allows ATE 10 to be readily towed to aircraft 12 for testing.

In the preferred embodiment described above, tests of the flight controls system are performed by transmitting test stimulus signals generated by system controller 16 through CMC 30, and receiving a second set of test data signals corresponding to results of the tests from CMC 30. Alternatively, transmission/receipt of test signals respectively from/to system controller 16 may bypass CMC 30 during the performance of some tests of the aircraft's flight controls systems. For example, test stimulus signals may be transmitted over CMC interface cable 28, via CMC 30, to an operational LRU such as SRM 100 during the stabilizer trim system test. However, the resulting test data signals are intercepted by a LRU cable 34 that connects to a port on SPD card 88, which monitors output from stabilizer transducers 90. The test data signals are transmitted directly to system controller 16, rather than back through EIU 74 and CMC 30, to decrease the time lag inherent in using CMC 30 for data transfer. This may be important for tests performed in real time.

Rather than utilizing CMC 30, it may be desirable to remove certain operational LRUs from the aircraft and connect LRU interface cables 34 to the LRU ports, as discussed previously. When so connected, system controller 16 emulates the function of the removed operational LRU and is used to test the aircraft components connected downstream of the removed LRU. One example of a test using this technique involves removal of FCC 96 and connection of an LRU interface cable 34 to the FCC port in EE bay 32 to perform an automatic stabilizer trim test. System controller 16 then emulates the function of FCC 96 and generates a signal that is transmitted directly to SRM 100, instructing the SRM to transmit a signal to a motor that moves the aircraft stabilizers. Transducers on the stabilizers then transmit an analog signal corresponding to the resulting position of the stabilizers to one of the FCUs, which converts the signal to a corresponding digital signal and retransmits the digital signal to CMC 30 via EIUs 74. CMC 30 in turn transmits a corresponding signal to system controller 16 for comparison to the expected position. This configuration allows the stabilizer to be adjusted without requiring the operator to set various switches in the cockpit during subsequent iterations of the test.

Details of Exemplary Flight Controls System Tests

To perform an automated functional test of the flight controls system of an aircraft 12 using ATE 10, an operator first boots up system controller 16 and places ATE 10 in auto mode by making a menu selection on the cart touch screen 24 or cockpit touch screen 56. The operator then loads the programmed instructions for the desired tests into the system controller 16 either by down-loading data from CCU 62, or by inserting a programmed streaming tape into tape drive 22. A particular test or subtest is selected from another menu appearing on touch screen 24 or 56. The operator can then run the automated test, controlling its progress through the touch screen. System controller 16 makes all pass/fail decisions, occasionally querying the operator for information, or instructing the operator via touch screen 24 or 56 to move switches and controls in the cockpit and elsewhere. System controller 16 compiles the data resulting from the tests in memory 18 for subsequent archiving by CCU 62.

A specific test example is illustrated in the block diagram of FIG. 5, which represents a portion of the rudder control test performed by ATE 10. After the operator has loaded the programmed test instructions, selected the appropriate subtest, and performed any preliminary configuration of the airplane controls, the test commences as system controller 16 commands switch matrix 128 via bus 108 to electronically connect cockpit interface cable 44 to counter 122. System controller 16 then generates a message on cockpit touch screen 56 instructing the operator, represented by block 134 of the diagram, to slowly depress and release a rudder pedal 136. System controller 16 of ATE 10 performs a series of checks to verify that the "feel" of the rudder over its full range of positioning is correct. As the operator moves rudder pedal 136, a load cell 52, mounted to rudder pedal 136 by the operator during the test set-up, generates an electrical pulse signal having a pulse repetition rate corresponding to the resistance force developed by the pedal when depressed. The pulse signal is transmitted to cockpit BOB 46, and then over cockpit interface cable 44 to ATE switch matrix 128. After it passes through switch matrix 128, the pulse signal is monitored by counter 122. System controller 16 receives digital signals from the counter indicating the pulse repetition rate corresponding to the resistance force developed by the rudder pedal at particular measurement points along the range of travel of the pedal.

For each measurement point, an onboard rudder pedal synchro transducer 90 generates an analog signal corresponding to the positioning of the rudder pedal which is transmitted to an SPD card 88 for conversion to a corresponding digital signal. The digital signal is then passed over an ARINC line 76 to EIU 74 and then to CMC 30. CMC 30 generates a corresponding digital signal and transmits it over ARINC line 68 within CMC interface cable 28 to ARINC receiver 118, which communicates over bus 108 with system controller 16. Similarly, another SPD card 88 receives an analog signal from a synchro transducer 90 that is mounted to monitor the position of rudder 138. This SPD is also connected to EIU 74 by ARINC line 76. System controller 16 repeatedly compares the digital signals corresponding to the rudder pedal force and rudder pedal position with acceptable limits stored in system controller memory 18 for each discrete measurement point of the pedal's travel, and generates pass or fail messages for display on cockpit touch screen 56. These test results are also stored in memory 18.

Alternatively, the digital rudder pedal position signal may be transmitted directly from SPD cards 88 over LRU interface cables 34 to ARINC receiver 118 of ATE 10, as shown by the dashed lines in FIG. 5. This alternative configuration eliminates the time lag associated with passing the resulting test signal through EIU 74 and CMC 30.

FIG. 6 provides a functional block diagram of another portion of the rudder control test, in which ATE 10 simulation capacities are used to simulate inflight changes in aircraft altitude and air speed while the aircraft is on the ground. When the aircraft is airborne, the response of the aircraft's rudder 138, as directed by SRM 100, to commands from rudder pedal 136 depends on the aircraft's altitude and speed. Referring to FIG. 6, system controller 16 generates a command signal instructing ADC 84 to enter the simulation mode. The simulation mode command signal is transmitted via ARINC transmitter 118 over ARINC data line 66 within CMC interface cable 28 to CMC 30. CMC 30 generates a corresponding simulation command signal that is transmitted over an ARINC line 78 to ADC 84. Once ADC 84 is in simulation mode, system controller 16 generates new command signals that are relayed by CMC 30 to instruct ADC 84 to generate false data signals corresponding to the desired simulated air speed and altitude. These false data signals are transmitted by ADC 84 over an ARINC line 80 to SRM 100.

In response, SRM 100 generates a rudder control signal that is transmitted via a mechanical amplifier linkage 140 to a rudder 138 to change the authority rudder pedal 136 has over movement of rudder 138 in accordance with the simulated in-flight conditions. Rudder pedal 136 is then moved by an operator, represented by block 134, who acts in response to an instruction appearing on cockpit touch screen 56. Rudder pedal 136 commands rudder 138 via an hydraulic/mechanical rudder linkage 142 to change the rudder's position. The position of the rudder is monitored by an onboard rudder angular position transducer 91 that generates an analog signal corresponding to the rudder position. An SPD card 88 monitors the analog signal from the angular position transducer 91, and converts the analog position signal into a digital signal that is transmitted to EIU 74 and to CMC 30. CMC 30 generates a corresponding digital signal that is transmitted over ARINC data line 68 within CMC interface cable 28 to ATE ARINC receiver 118, which communicates the signal to system controller 16.

System controller 16 compares the signal corresponding to the actual rudder position with the expected rudder position (stored in memory 18 as part of the test data) that should result in response to the movement of the rudder pedal under the authority established for the simulated air-speed and altitude, and generates pass or fail information that is displayed on cockpit touch screen 56 and stored in memory 18. Alternatively, SPD card 88 may transmit the digital signal corresponding to the actual rudder position directly to ATE 10 over an LRU interface cable 34, bypassing EIU 74 and CMC 30.

Rather than using the software simulation routine embodied in ADC 84, the aircraft altitude and air speed may instead be pneumatically simulated using the ATE's air data test set 36. System controller 16 communicates over bus 108 to control performance of air data test set 36, instructing test set 36 to generate a pneumatic pressure or vacuum correlating to the desired simulated flight conditions. Air data test set 36 is connected by pneumatic interface hoses 38 to Pitot tube sensors 127 onboard the aircraft, which feed pressure ports on ADC 84. ADC 84 generates air speed and altitude signals corresponding to this applied pressure and transmits the signals to SRM 100.

A further example of a test utilizing ATE 10 simulation capacity is the spoiler (air brake) test, which is shown in the functional block diagram of FIG. 7. During this test, system controller 16 checks to ensure that spoilers 144 of aircraft 12 are correctly positioned in response to movement of a cockpit spoiler handle 146 by an operator 134. Spoilers 144 are used primarily when landing, to slow the aircraft. Spoiler handle 146 normally should thus be functional only when aircraft 12 is flying at less than certain predetermined air speeds and altitudes. If an autopilot system is employed to control the plane during landing, the plane's landing gear may need to be extended for spoiler handle 146 to have authority. Thus, in-flight conditions for the aircraft must be simulated to test spoilers 144 while aircraft 12 is on the ground.

Alternatively, if the aircraft's automatic spoiler system is to be used, PSEU 82 is placed in the simulation mode and is instructed to generate false data concerning configuration of the aircraft's proximity switches as required to actuate spoiler handle 146.

System controller 16 also generates commands that are displayed on cockpit touch screen 56 instructing operator 134 to move spoiler handle 146. Movement of spoiler handle 146 causes a signal to be transmitted over an hydraulic/mechanical link 148, which raises spoilers 144 to a landing configuration. Remote clinometers 42 that have been mounted on spoilers 144 by an operator during setup of the test generate analog signals corresponding to the position of spoilers 144 and transmit those signals to switch matrix 128 of ATE 10.

The analog signals are converted to corresponding digital signals by DMM 120. DMM 120 generates digital signals corresponding to the positioning of spoilers 144, and communicates the digital signals over bus 108 to system controller 16. System controller 16 then checks to ensure that the spoiler positions are correct as compared to the expected positions (stored in memory 18), as a function of the movement of spoiler handle 146. Other types of tests of the aircraft flight controls are implemented by ATE 10 in analogous fashion, in accord with programmed instructions downloaded from CCU 62.

While the present invention has been disclosed with respect to the preferred embodiment thereof, those of ordinary skill in the art will understand that further modifications to the invention, including but not limited to those described above, may be made within the scope of the claims appended below. Accordingly, it is intended that the scope of the invention should not be limited to what has been disclosed above, but instead should be determined entirely by reference to the following claims.

The embodiments of the invention in which an exclusive property or privilege is claimed are defined as follows:

1. In an integrated system for testing a plurality of systems on an aircraft, an automated test apparatus for testing a flight controls system of the aircraft, said apparatus comprising:

a system controller having memory means for storing programmed instructions that control operation of the automated test apparatus to automatically test the flight controls system and for storing resulting flight controls system test data;

information entry means for entering information into said system controller;

output means for outputting said test data from said system controller;

instrumentation means for generating a first set of signals that are input to the flight controls system, and for monitoring a second set of signals that are produced by the flight controls system, said instrumentation means being controlled by said system controller and connected to provide digital signals to said system controller corresponding to the second set of signals; and interface means, connecting said system controller to the flight controls system, for automatically controlling and monitoring the flight controls system in accordance with the programmed instructions so that a plurality of functions of the flight controls system are effected while the aircraft is on the ground, to test the operation of the flight controls system in coordination with the first set of signals generated by said instrumentation means.

2. The automated test apparatus of claim 1, wherein the aircraft includes an onboard maintenance computer that is connected to the flight controls system of the aircraft and a non-volatile memory that is programmed to run onboard tests of the flight controls system, said onboard maintenance computer being connected through said interface means to said system controller and controlled thereby in accordance with the programmed instructions to run the onboard tests of the flight controls system, results of the onboard tests being conveyed through said interface means to said system controller.

3. The automated test apparatus of claim 2, wherein the flight controls system of the aircraft includes line replaceable units for controlling and monitoring aircraft flight controls, and wherein said system controller controls the line replaceable units in accordance with the programmed instructions, to simulate in-flight conditions of the aircraft during testing of the aircraft on the ground.

4. The automated test apparatus of claim 3, wherein the aircraft's line replaceable units include a flap control unit and said system controller controls said flap control unit to simulate the in-flight positioning of the aircraft's flaps during said ground testing.

5. The automated test apparatus of claim 3, wherein the aircraft's line replaceable units include a proximity switch electronics unit and said system controller controls said proximity switch electronics unit to simulate the in-flight configuration of the aircraft's proximity switches during said ground testing.

6. The automated test apparatus of claim 3, wherein the aircraft's line replaceable units include an air data computer and said system controller controls said air data computer to simulate in-flight altitude and air speed of the aircraft during said ground testing.

7. The automated test apparatus of claim 1, wherein the flight controls system of the aircraft includes line replaceable units for controlling and monitoring aircraft flight controls, said system controller being connectable to the aircraft through said interface means to replace particular line replaceable units that have been removed from the aircraft and to emulate the function of the removed line replaceable units in accordance with the programmed instructions during said testing of the flight controls system.

8. The automated test apparatus of claim 1, wherein the flight controls system of the aircraft includes pressure sensing devices and said instrumentation means comprise means for pneumatically stimulating the pressure sensing devices to simulate in-flight air speeds and altitudes in the flight controls system while the aircraft is on the ground.

9. The automated test apparatus of claim 1, wherein the instrumentation means include transducers, placeable at selected points on the aircraft, to augment the testing of the flight controls system by measuring specific parameters associted with operation of the flight controls at the selected points on the aircraft.

10. The automated test apparatus of claim 1, further comprising remote means for manually entering information in response to instructions output on the remote means, the remote means being connected to said system controller and disposed in the flight deck of the aircraft during said tests of the flight controls system, the system controller causing test instructions to be output on the remote means in accordance with the programmed instructions, thereby directing a test operator to set controls of the flight controls system.

11. The automated test apparatus of claim 1, wherein said system controller, information entry means, output means, and instrumentation means are mounted on a cart that is external to the aircraft and is mobile, enabling the cart to be moved to the aircraft to test the flight controls system.

12. The automated test apparatus of claim 1, wherein the system controller is operative to transmit the test data to a central storage facility for integration with other test data produced by the integrated system.

13. An automated test apparatus for testing a flight controls system of an aircraft, the aircraft including an onboard maintenance computer that is connected to the flight controls system and a non-volatile memory that is programmed to run onboard tests of the flight controls system, said apparatus comprising:

a system controller having memory means for storing programmed instructions that control operation of the automated test apparatus to automatically test the flight controls system and for storing flight controls system test data;

information entry means for entering information into said system controller;

output means for outputting said test data from said system controller;

instrumentation means for generating a first set of signals that are input to the flight controls system, and for monitoring a second set of signals that are produced by the flight controls system, said instrumentation means being controlled by said system controller and connected to provide digital signals to said system controller corresponding to at least some of the second set of signals; and interface means connecting said system controller to at least said onboard maintenance computer, said system controller controlling the onboard maintenance computer in accordance with the programmed instructions to run the onboard tests of the flight controls system while the aircraft is on the ground, in coordination with the first set of signals generated by said instrumentation means, results of the onboard tests being conveyed through said interface means to said system controller.

14. The automated test apparatus of claim 13, wherein the flight controls system of the aircraft includes line replaceable units for controlling and monitoring aircraft flight controls and wherein said system controller controls the line replaceable units in accordance with the programmed instructions, to simulate in-flight conditions of the aircraft during testing of the aircraft on the ground.

15. The automated test apparatus of claim 14, wherein the aircraft's line replaceable units include a flap control unit and said system controller controls said flap control unit to simulate the in-flight positioning of the aircraft's flaps during the ground testing.

16. The automated test apparatus of claim 14, wherein the aircraft's line replaceable units include a proximity switch electronics unit and said system controller controls said proximity switch electronics unit to simulate the in-flight configuration of the aircraft's proximity switches during said ground testing.

17. The automated test apparatus of claim 14, wherein the aircraft's line replaceable units include an air data computer and said system controller controls said air data computer to simulate in-flight altitude and air speed of the aircraft during said ground testing.

18. The automated test apparatus of claim 13, wherein the flight controls system of the aircraft includes line replaceable units for controlling and monitoring aircraft flight controls, said system controller being connectable to the aircraft through said interface means to replace particular line replaceable units that have been removed from the aircraft and to emulate the function of the removed line replaceable units in accordance with the programmed instructions during said testing of the flight controls system.

19. The automated test apparatus of claim 13, wherein the flight controls system of the aircraft includes pressure sensing devices and said instrumentation means comprise means for pneumatically stimulating the pressure sensing devices to simulate in-flight air speeds and altitudes in the flight controls system.

20. The automated test apparatus of claim 13, wherein the instrumentation means include remote transducers, placeable at selected points on the aircraft, to augment the testing of the flight controls system by measuring specific parameters associated with operation of the flight controls at the selected points on the aircraft.

21. The automated test apparatus of claim 13, further comprising remote means for manually entering information in response to instructions output on the remote means, the remote means being connected to said system controller and disposed in the flight deck of the aircraft during said tests of the flight controls system, the system controller causing test instructions to be output from the remote means in accordance with the programmed instructions, thereby directing a test operator to set controls of the flight controls system.

22. The automated test apparatus of claim 13, wherein said system controller, information entry means, output means, and instrumentation means are mounted on a cart that is external to the aircraft and is mobile, enabling the cart to be moved to the aircraft to test the flight controls system.

23. A method for automatically testing a flight controls system of an aircraft on the ground, the aircraft including an onboard maintenance computer that is connected to the flight controls system and a nonvolatile memory that is programmed to run onboard tests of the flight controls system, said method comprising:

storing programmed instructions for testing the flight controls system in a system controller having memory capacity;

interfacing the system controller with the aircraft's onboard maintenance computer during the tests, to control the onboard maintenance computer in accordance with the stored programmed instructions;

generating a first set of signals with instrumentation means controlled by the system controller in accordance with the programmed instructions to run the onboard tests of the flight controls system;

monitoring a second set of signals produced by testing of the flight controls system;

storing test data corresponding to the second set of signals in the system controller; and outputting the stored test data to an output device.

24. The method of claim 23, further comprising the step of simulating of in-flight conditions of the aircraft during testing of the aircraft while on the ground.

25. The method of claim 23, further comprising:

removing line replaceable units included in the aircraft; and emulating the function of the removed line replaceable units with the system controller in accordance with the stored programmed instructions during said testing of the flight controls system.

* * * * *